United States Patent [19]

Scheiber

[11] 3,950,597

[45] Apr. 13, 1976

[54] POWDER COMPOSITIONS OF POLYNARY OXIDES AND COPPER

[75] Inventor: David Hitz Scheiber, Wilmington, Del.

[73] Assignee: E. I. Du Pont de Nemours and Company, Wilmington, Del.

[22] Filed: Dec. 24, 1974

[21] Appl. No.: 536,319

Related U.S. Application Data

[63] Continuation-in-part of Ser. No. 326,952, Jan. 26, 1973, abandoned.

[52] U.S. Cl. ................ 428/539; 252/518; 252/520; 252/521; 252/512

[51] Int. Cl.[2] ........................ H01B 1/02; B32B 9/04

[58] Field of Search ........... 252/512, 518, 520, 521; 428/539

[56] References Cited

UNITED STATES PATENTS

| | | | |
|---|---|---|---|
| 2,371,211 | 3/1945 | Barrington | 252/512 X |
| 2,415,036 | 1/1947 | Quinn | 252/512 |
| 3,553,109 | 1/1971 | Hoffman | 252/521 |
| 3,583,931 | 6/1971 | Bouchard | 252/521 X |
| 3,630,969 | 12/1971 | Popowich | 252/514 |
| 3,681,262 | 8/1972 | Bouchard | 252/521 X |

*Primary Examiner*—Richard D. Lovering
*Assistant Examiner*—Josephine Lloyd

[57] ABSTRACT

This invention relates to improved powder compositions useful for forming resistors on dielectric substrates; the compositions comprise certain polynary oxides of silver and/or copper ions having a pyrochlore-related crystal structure, plus dielectric material, and 1–10% copper powder. Also dispersions thereof and resistors made by firing these compositions.

9 Claims, No Drawings

POWDER COMPOSITIONS OF POLYNARY OXIDES AND COPPER

CROSS-REFERENCE TO RELATED APPLICATION

This is a continuation-in-part application of my U.S. Ser. No. 326,952, filed Jan. 26, 1973 and now abandoned.

BACKGROUND OF THE INVENTION

The novel powder compositions of this invention are improvements over those disclosed and claimed in Bouchard U.S. Pat. No. 3,583,931, issued June 8, 1971. That patent teaches the benefits of bismuth and ruthenium and/or iridium in polynary oxides having pyrochlore-related crystal structure for electrical resistor applications. U.S. Pat. No. 3,553,109 to Lewis C. Hoffman teaches resistor compositions comprising such polynary oxides (and related polynary oxides) plus inorganic binder and finely-divided noble metals. Resistor compositions according to these teachings have enjoyed considerable commercial success because of the excellent control they offer in providing a range of resistors with reproducible values of resistivity, little affected by temperature or humidity in use, and readily printed and fired on dielectric supports.

A primary means of establishing the resistivity of a fired resistor according to the teaching of Hoffman is to adjust the relative proportions of polynary oxide, noble metal, and inorganic binder in the composition. In general, the unusual properties of the polynary oxide are adjusted toward higher resistivities by increasing the proportion of binder and adjusted toward lower resistivities by increasing the proportion of finely divided noble metal. However, increasingly large proportions of noble metal to polynary oxide also produce an increase in TCR (temperature coefficient of resistance) and obviate many of the advantages which have led to the gradual replacement of noble metal/glass compositions (such as the palladium/silver/glass compositions of D'Andrea U.S. Pat. No. 2,924,540) by the more sophisticated polynary oxide containing compositions.

Chemical substitution in the polynary oxide itself has been investigated as a method for adjusting electrical properties. Thus the patents cited above contemplate, e.g., the substitution ot yttrium, thallium, indium, cadmium, lead or the rare earth metals of atomic number 57–71 inclusive for some of the bismuth in $Bi_2Ru_2O_7$ and $Bi_2Ir_2O_7$; and platinum, titanium, tin, chromium, rhodium, rhenium, zirconium, antimony or germanium for some of the ruthenium or iridium. There is a need, however, for compositions capable of producing resistivities that are substantially lower than those obtained with $Bi_2(Ru,Ir)_2O_7$, while maintaining the desirably flat temperature response. Such low resistivities are often below 10 ohms/square, preferably 1–5 ohms/square.

U.S. Pat. No. 3,324,049 teaches cermet resistance materials of glass and one or more oxides or Ir, Os and Ru, the glass containing "CuO dissolved in the glass and forming a structural part of the glass." Polynary oxides of pyrochlore-related crystal structures are neither disclosed nor suggested. In fact, not even one noble metal oxide is specifically disclosed. The CuO in the glass does not lower resistivity of the claimed materials, but to the contrary (at column 3, lines 45–48) it is disclosed that when an oxide of copper is added to the raw glass materials prior to fritting or to prefritted glass, there is substantially no change in ohmic resistance of the resultant resistor. Hence there is no reason to expect that CuO, or Cu metal, would lower resistivity of resistor compositions.

SUMMARY OF THE INVENTION

In powder compositions comprising conductive polynary oxides of pyrochlore-related crystal structure and dielectric material, useful for printing resistors in dielectric substrates, this invention provides improved powder compositions comprising 1–10% by weight of finely-divided copper metal powder, based on total weight of the composition.

The polynary oxide has the formula $M_xM'_{2-x}M''_2O_{7-z}$, wherein M is at least one of Ag or Cu; M' is Bi or a mixture of at least one-half Bi plus up to one-half of one or more cations from among (a) bivalent Cd or Pb and (b) trivalent Y, Tl, In and rare earth metals of atomic number 57–71, inclusive; M'' is at least one of (a) Ru, (b) Ir, and (c) a mixture of at least three-fourths of at least one of Ru and Ir and up to one-fourth of at least one of Pt, Ti, and Rh; $x$ is in the range 0.10 to 0.6 (preferably 0.1 to 0.5); and $z$ is in the range 0.10 to 1.0 and is equivalent to the sum of the monovalent cations M and half of divalent cations in the polynary oxide.

The compositions preferably contain 1–5% copper. The compositions may contain one or more of the optional additives, discussed below. The compositions may be dispersed in an inert liquid vehicle for ease of printing.

Also a part of this invention are electrical elements such as resistors obtained by depositing the powder compositions of this invention on a dielectric substrate and firing the same to sinter the composition to an electrically continuous coating adherent to the substrate.

At least one percent copper based on total solids should be present to produce the desired effect; normally no more than 10% copper is present, since the properties obtained with more than 10% copper can be achieved by other polynary oxide powder compositions; furthermore, where more than 10% copper powder is present the properties of the resultant resistor would be expected to be greatly influenced by such quantities of copper, obviating the advantages of the polynary oxide.

DETAILED DESCRIPTION

The novel feature in the compositions of the present invention is the presence therein of metallic copper powder. The addition of copper powder to compositions containing conductive polynary oxides of the pyrochlore structure permits the reproducible preparation of low resistivity fired resistors which exhibit reduced room temperature drift in resistance. The mechanism of producing this beneficial effect is not understood due to the complexity of the chemical and physical effects which could occur in firing. It has been found that copper powder additions even lower the resistivity obtained with polynary oxides which themselves contain copper. Even if copper remained as the metal in the fired resistor, it seems unlikely that such small additions of copper could lower the resistivity to the extent found. Although not intended to be limiting, it is theorized that perhaps copper and/or an oxide thereof alters the properties of the fired glassy matrix of the resistor in such a way to modify the formation of conductive chains of polynary oxide. Thus, if more coherent conductivity pathways are formed due to enhanced sinterability of polynary oxide or modification of glass properties, lower resistivity could result.

The term polynary oxide of the pyrochlore structure as used herein is intended to refer to polynary oxides of pyrochlore-related crystal structures having the formula $M_xM'_{2-x}M''_2O_{7-z}$, wherein M is at least one of Ag or Cu; M' is Bi or a mixture of at least one-half Bi plus up to one-half of one or more cations from among (a) bivalent Cd or Pb and (b) trivalent Y, Tl, In and rare earth metals of atomic number 57–71, inclusive; M'' is at least one of (a) Ru,, (b) Ir, and (c) a mixture of at least three-fourths of at least one of Ru and Ir and up to one-fourth of at least one of Pt, Ti, and Rh; $x$ is in the range 0.10 to 0.6 (preferably 0.1 to 0.5); and $z$ is in the range 0.10 to 1.0 and is equivalent to the sum of the monovalent cations M and half of divalent cations in the polynary oxide.

Generally the powder compositions comprise by weight 1–10% copper powder; 5–90% of a polynary oxide of pyrochlorerelated crystal structure; 10–95% dielectric material; 0–69% noble metal powder; and 0–10% of additive binary oxides such as CdO, $V_2O_5$, $Cr_2O_3$, $Mn_2O_3$, $Fe_3O_4$, $Co_3O_4$, NiO, CuO, and mixtures thereof. The CdO may be part of the dielectric material.

The polynary oxides are prepared by the methods disclosed in the above-mentioned patents; however, the Cu and Ag containing polynary oxides are not disclosed therein, and may be prepared in similar fashion, as follows.

The Ag and Cu polynary oxides are prepared by heating together the requisite oxides or the readily oxidizable metals or salts which provide a source of the particular elements. Reaction should be carried out under oxidizing conditions at a temperature ranging from about 600°C. to about 1200°C. Direct firing in air at ordinary pressure is usually most convenient, although an atmosphere of oxygen or superatmospheric pressures may be advantageous if oxidizable metals in finely-divided form are used as a source of the requisite elements. As a source of the silver or copper cations finely-divided silver or copper metal may be used, but repeated grinding and firing in an oxygen-rich environment should then be used to insure complete oxidation. The preferred source of silver is $AgNO_3$ which is easily converted to the oxide under firing conditions. $Cu_2O$ is preferred as the source of copper (probably, though not necessarily, univalent). Thorough grinding together of the reacting components assists in promoting complete reaction which is usually obtained in times between a few hours and a day. Silica or porcelain vessels may be used but Pt vessels are preferred at high temperature to avoid any contamination. The completion of reaction is conveniently judged by obtaining a single phase X-ray diffraction corresponding to the pyrochlore structure. Electrical conductivity may be determined on pressed compacts of the powdered oxide, or more functionally, on composites of the oxide produce with low melting glasses in the proportion desired to form electrical resistor elements.

Optional additives may be added to the powder compositions, such as those disclosed in Schubert U.S. Pat. No. 3,560,410; Hoffman U.S. Pat. No. 3,553,109; Popowich U.S. Pat. No. 3,630,969; and Bouchard U.S. Pat. No. 3,681,202. The presence (and amount) of optional additives are determined by the electrical properties desired in the fired resistor. When the powder composition is to be dispersed in an inert liquid vehicle, the type and amount of vehicle is a matter of selection by one skilled in the art, the amount of vehicle generally being 10–90% of the resulting dispersion.

The dielectric material may be any inorganic material which serves to bind the noble metal and oxide(s) to the substrate. The inorganic binder may be any of the glass frits employed in resistor compositions for this general type. Such frits are generally prepared by melting a glass batch composed of the desired metal oxides, or compounds which will produce the glass during melting, and pouring the melt into water. The coarse frit is then milled to a powder of the desired fineness. The patents to Larsen and Short, U.S. Pat. No. 2,822,279 and to Hoffman, U.S. Pat. No. 3,207,706 describe some frit compositions which can be employed either alone or in combination with glass wetting agents such as bismuth oxide. Typical frit compositions usable as binders in the compositions of this invention include borosilicate glasses such as lead borosilicate, cadmium borosilicate and similar borosilicates. Also, mixtures of various inorganic binders may be used.

Noble metals may additionally comprise a free metallic component of the resistor compositions. These include gold, silver, platinum and palladium.

The compositions are used to produce thick film resistors as disclosed in the above patents; printing may be by conventional screen or stencil techniques with optional inert liquid vehicle, as therein described; firing techniques are similarly described therein. The above patents are thus incorporated by reference herein.

Generally, application of the resistor composition in paint or paste form to the substrate may be effected in any desired manner. It will generally be desired, however, to effect the application in precise pattern form, which can be readily done in applying well-known screen stencil techniques or methods. The resulting print or pattern will then be fired in the usual manner at a temperature from about 650°–950°C. in an air atmosphere employing the usual firing lehr.

The components of the powder composition are finely divided so that they may be screen printed; generally the average particle size is less than 20 microns.

EXAMPLES

In the Examples and elsewhere in the specification and claims, all parts, percentages and ratios are by weight, unless otherwise stated.

Resistances were determined with a Non-Linear Systems Series X-1 Ohmmeter.

Fired resistor film thicknesses were measured with a Brush Instruments Division (Clevite Corp.) Surfanalyzer. The thickness, nominally 1 mil, was normally less than 1 mil; sheet resistivity (ohm/square/mil) was determined by multiplying the resistance of the 100 × 200 mil resistor pad by the actual thickness, and dividing by two.

TCR (temperature coefficient of resistance) was determined at 125°C. and at –75°C. from $$TCR = (\text{delta } R/R) \times 10^4 \text{ ppm/°C.}$$

where R is the resistance at the reference temperature, about 25°C., and "delta R" is the change in resistance caused by heating to 125°C., or cooling to –75°C. TCR is positive if the resistor shows an increase in resistance upon being heated and a decrease in being cooled. Otherwise, TCR is negative. If resistance does not change with temperature, the TCR is zero.

All of the polynary oxide powders employed in the Examples and Showings were finely divided, having an average particle size of less than 20 microns. The copper powder had a particle size in the range 0.3–7 microns, and platinum powder had an average particle size less than 1 micron.

Examples 1 – 4; Comparative Showing A

Powder compositions were prepared using finely divided powders of the polynary oxides set forth in Table I; Pt and Cu powder as there described; and glass frit (43.5% $Pb_3O_4$, 4.3% $Al_2O_3$, 9.8% CaO, 4.9% $B_2O_3$, and 37.5% $SiO_2$). The powder compositions were dispersed in a vehicle of 10% ethyl cellulose and 90% terpineol. Sixty parts of conductive materials (in the proportions set forth in Table I) and 17 parts of glass were dispersed in 23 parts of vehicle.

Quadruplicate resistors were made with each dispersion, as follows. The dispersion was printed through a 200 mesh onto a prefired one-inch-square 96% alumina chip with prefired Pd/Ag terminations; the resultant resistor pads were 100 × 200 mils in surface area. The printed substrate was dried at 100°C. for about 10 minutes, and then fired to a maximum temperature of 850°C. with 10 minutes at peak temperature. Table I reports the thickness of the fired resistor and various electrical properties. The change in resistance was determined after standing under no electrical load and at ambient temperature and humidity for 130 hours (except 47 hours, Ex. 1).

The data show that using three different polynary oxides, copper powder and a single glass, low resistivities were obtained in each of Examples 1 – 4, while in Showing A a composition of the polynary oxide and glass of Example 1, plus Pt powder rather than Cu powder, produced a resistivity more than an order of magniture higher than that of Examples 2 – 4 and about five times higher than that of Example 1; this illustrates the beneficial effect of the copper powder of the present invention, versus even a powder as conductive as platinum.

TABLE I

| Example or Showing | Conductive phases Type | Parts by wt. | Fired Resistor Thickness (mils) | Resistivity (ohms/sq.) | TCR (PPM/°C.) 125°C. | −75°C. | Δ R (%) |
|---|---|---|---|---|---|---|---|
| A | $Bi_2Ru_2O_7$ | 57.4 | 0.65 | 73.3 | +328 | +139 | +0.21 |
| | Pt | 2.6 | | | | | |
| 1 | $Bi_2Ru_2O_7$ | 57.4 | 0.80 | 15.0 | +1651 | +2066 | +0.16* |
| | Cu | 2.6 | | | | | |
| 2 | $Bi_2Ru_2O_7$ | 54 | 0.60 | 5.20 | +2571 | +2839 | −0.20 |
| | Cu | 6.0 | | | | | |
| 3 | $Cu_{0.5}Bi_{1.5}Ru_2O_{6.5}$ | 57.4 | 0.70 | 2.46 | +2604 | +2816 | −0.11 |
| | Cu | 2.6 | | | | | |
| 4 | $Ag_{0.5}Bi_{1.5}Ru_2O_{6.5}$ | 57.4 | 0.85 | 3.54 | +2190 | +2168 | −0.13 |
| | Cu | 2.6 | | | | | |

*Determined after 47 hours.

Examples 5 – 9; Showings B – E

The procedure of Examples 1 – 4 was repeated using a different glass frit (25.7% PbO, 20.1% $B_2O_3$, 19.7% $SiO_2$, 7.9% $Al_2O_3$, 24.1% ZnO, 2.2% $ZrO_2$, and 0.3% $Na_2O$).

Five different polynary oxides were employed as set forth in Table II; the effect of Cu powder additions was compared with that of Pt and Au powder additions. Sixty six parts of conductive solids and 14 parts of glass frit were dispersed in 20 parts vehicle.

The data show that low resistivities were obtained in each example with the Cu additions of the present invention. The comparative showings resulted in higher resistivities even with other conductive powders than Cu, and/or were less stable to drift in resistance (see Example 5 versus Showing C).

TABLE II

| Example or Showing | Conductive phases Type | Parts by wt. | Fired Resistor Thickness (mils) | Resistivity (ohms/sq.) | TCR (PPM/°C.) 125°C. | −75°C. | ΔR (%) |
|---|---|---|---|---|---|---|---|
| 5 | $Bi_2Ru_2O_7$ | 60.0 | 0.75 | 32.85 | −50 | −278 | +0.84 |
| | Cu | 6.0 | | | | | |
| B | $Bi_2Ru_2O_7$ | 63.1 | 0.75 | 18.8 | −82 | −321 | +1.09 |
| | Pt | 2.9 | | | | | |
| C | $Bi_2Ru_2O_7$ | 60.0 | 0.75 | 3.66 | +448 | +361 | +3.01 |
| | Pt | 6.0 | | | | | |
| D | $Bi_2Ru_2O_7$ | 63.1 | 0.75 | 33.29 | −149 | −437 | +1.57 |
| | Au | 2.9 | | | | | |
| 6 | $Cu_{0.5}Bi_{1.5}Ru_2O_{6.5}$ | 63.1 | 0.75 | 2.72 | +1498 | +1574 | +1.45 |
| | Cu | 2.9 | | | | | |
| E | $Cu_{0.5}Bi_{1.5}Ru_2O_{6.5}$ | 63.1 | 0.80 | 3.86 | +528 | +558 | +3.84 |
| | Pt | 2.9 | | | | | |
| 7 | $Ag_{0.5}Bi_{1.5}Ru_2O_{6.5}$ | 63.1 | 0.75 | 3.66 | + 448 | +361 | +3.01 |
| | Cu | 2.9 | | | | | |
| 8 | $Cd_{0.5}Bi_{1.5}Ru_2O_{6.75}$ | 63.1 | 0.80 | 4.67 | +519 | +690 | +0.51 |
| | Cu | 2.9 | | | | | |
| 9 | $BiGdRu_2O_7$ | 63.1 | 0.90 | 6.24 | +1174 | +1483 | +0.02 |
| | Cu | 2.9 | | | | | |

I claim:

1. In powder compositions comprising conductive polynary oxides of pyrochlore-related crystal structure and dielectric material, useful for printing resistors on dielectric substrates, improved powder compositions wherein the polynary oxide has the formula $M_xM'_{2-x}M''_2O_{7-z}$, wherein M is at least one of Ag or Cu; M' is Bi or a mixture of at least one-half Bi plus up to one-half of one or more cations from among (a) bivalent Cd or Pb and (b) trivalent Y, Tl, In and rare earths metals of atomic number 57–71, inclusive; M'' is at least one of (a) Ru, (b), Ir, and (c) a mixture of at least three-fourths of at least one of Ru and Ir and up to one-fourth of at least one of Pt, Ti, and Rh; $x$ is in the range 0.10 to 0.6; and $z$ is in the range 0.10 to 1.0 and is equivalent to the sum of the monovalent cations M and half of divalent cations in the polynary oxide, and wherein the composition additionally comprises 1–10 % by weight of finely divided copper metal powder, based on total weight of the composition.

2. Compositions according to claim 1 wherein $x$ is in the range 0.1–0.5.

3. Compositions according to claim 1 comprising 1–5% copper.

4. Compositions according to claim 2 comprising 1–5% copper.

5. Compositions according to claim 1 dispersed in an inert liquid vehicle.

6. Compositions according to claim 2 dispersed in an inert liquid vehicle.

7. An electrical element comprising a dielectric substrate having adherent thereto the composition of claim 1.

8. An electrical element comprising a dielectric substrate having adherent thereto the composition of claim 2.

9. An electrical element comprising a dielectric substrate having adherent thereto the composition of claim 3.

* * * * *